United States Patent
Laird et al.

(10) Patent No.: US 9,304,560 B2
(45) Date of Patent: Apr. 5, 2016

(54) BACKUP POWER FOR REDUCING HOST CURRENT TRANSIENTS

(71) Applicant: Western Digital Technologies, Inc., Irvine, CA (US)

(72) Inventors: William K. Laird, Corona, CA (US); John R. Agness, Laguna Hills, CA (US); Henry S. Ung, Tustin, CA (US); Ryan P. Mayo, Irvine, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 287 days.

(21) Appl. No.: 13/957,898

(22) Filed: Aug. 2, 2013

(65) Prior Publication Data

US 2014/0380067 A1    Dec. 25, 2014

Related U.S. Application Data

(60) Provisional application No. 61/837,005, filed on Jun. 19, 2013.

(51) Int. Cl.
*G06F 1/00*    (2006.01)
*G06F 1/26*    (2006.01)

(52) U.S. Cl.
CPC . *G06F 1/26* (2013.01); *G06F 1/263* (2013.01)

(58) Field of Classification Search
CPC ......... G06F 1/26; G06F 1/305; G06F 1/3221; G06F 1/3225
USPC ............................ 713/300; 365/226, 228, 229
See application file for complete search history.

(56) References Cited

U.S. PATENT DOCUMENTS

| | | | |
|---|---|---|---|
| 4,400,711 A | 8/1983 | Avery | |
| 4,484,244 A | 11/1984 | Avery | |
| 4,712,196 A * | 12/1987 | Uesugi | 365/229 |
| 5,293,082 A | 3/1994 | Bathaee | |
| 5,321,663 A * | 6/1994 | Nishi | 365/229 |
| 5,673,412 A * | 9/1997 | Kamo et al. | 711/114 |
| 5,930,096 A | 7/1999 | Kim | |
| 6,728,084 B2 | 4/2004 | Ziemer et al. | |
| 6,856,556 B1 | 2/2005 | Hajeck | |
| 6,901,298 B1 * | 5/2005 | Govindaraj et al. | 700/21 |
| 6,934,135 B1 | 8/2005 | Ryan | |
| 7,126,857 B2 | 10/2006 | Hajeck | |
| 7,131,011 B2 * | 10/2006 | Westerinen et al. | 713/300 |
| 7,154,725 B2 | 12/2006 | Chloupek et al. | |
| 7,352,159 B2 | 4/2008 | Luo et al. | |
| 7,369,350 B2 | 5/2008 | Yang | |
| 7,430,136 B2 | 9/2008 | Merry, Jr. et al. | |
| 7,447,807 B1 | 11/2008 | Merry et al. | |
| 7,502,256 B2 | 3/2009 | Merry, Jr. et al. | |

(Continued)

OTHER PUBLICATIONS

Demerjian Charlie, Backup capacitors come to Sandforce drives, http://semiaccurate.com/2012/09/18/backup-capacitors-come-to-sandforce-drives/, Sep. 18, 2012.*

(Continued)

*Primary Examiner* — Mark Connolly

(57) ABSTRACT

A data storage device (DSD) includes a power supply from a host and a charge storage element. A current transient is detected on the power supply from the host and it is determined whether the current transient exceeds a current threshold. When the current transient exceeds the current threshold, power is drawn from the charge storage element to reduce power drawn from the host.

20 Claims, 11 Drawing Sheets

(56) References Cited

U.S. PATENT DOCUMENTS

Figure 1:
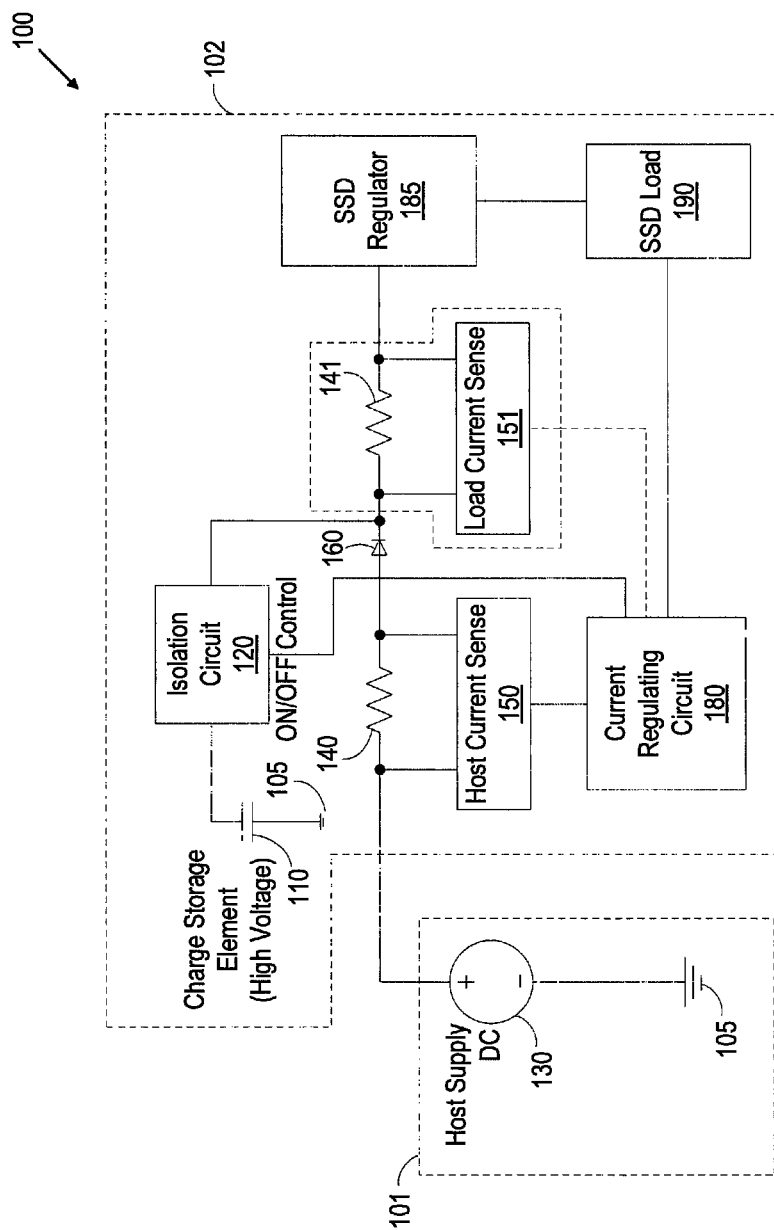

| Patent No. | | Date | Inventor(s) | |
|---|---|---|---|---|
| 7,509,441 | B1 | 3/2009 | Merry et al. | |
| 7,596,643 | B2 | 9/2009 | Merry, Jr. et al. | |
| 7,653,778 | B2 | 1/2010 | Merry, Jr. et al. | |
| 7,685,337 | B2 | 3/2010 | Merry, Jr. et al. | |
| 7,685,338 | B2 | 3/2010 | Merry, Jr. et al. | |
| 7,685,374 | B2 | 3/2010 | Diggs et al. | |
| 7,733,712 | B1 | 6/2010 | Walston et al. | |
| 7,765,373 | B1 | 7/2010 | Merry et al. | |
| 7,886,173 | B2 * | 2/2011 | Krieger et al. | 713/330 |
| 7,898,855 | B2 | 3/2011 | Merry, Jr. et al. | |
| 7,912,991 | B1 | 3/2011 | Merry et al. | |
| 7,936,603 | B2 | 5/2011 | Merry, Jr. et al. | |
| 7,962,792 | B2 | 6/2011 | Diggs et al. | |
| 8,078,918 | B2 | 12/2011 | Diggs et al. | |
| 8,090,899 | B1 | 1/2012 | Syu | |
| 8,095,851 | B2 | 1/2012 | Diggs et al. | |
| 8,108,692 | B1 | 1/2012 | Merry et al. | |
| 8,122,185 | B2 | 2/2012 | Merry, Jr. et al. | |
| 8,127,048 | B1 | 2/2012 | Merry et al. | |
| 8,135,903 | B1 | 3/2012 | Kan | |
| 8,151,020 | B2 | 4/2012 | Merry, Jr. et al. | |
| 8,161,227 | B1 | 4/2012 | Diggs et al. | |
| 8,166,245 | B2 | 4/2012 | Diggs et al. | |
| 8,243,525 | B1 | 8/2012 | Kan | |
| 8,254,172 | B1 | 8/2012 | Kan | |
| 8,261,012 | B2 | 9/2012 | Kan | |
| 8,296,625 | B2 | 10/2012 | Diggs et al. | |
| 8,312,207 | B2 | 11/2012 | Merry, Jr. et al. | |
| 8,316,176 | B1 | 11/2012 | Phan et al. | |
| 8,341,339 | B1 | 12/2012 | Boyle et al. | |
| 8,375,151 | B1 | 2/2013 | Kan | |
| 8,392,635 | B2 | 3/2013 | Booth et al. | |
| 8,397,107 | B1 | 3/2013 | Syu et al. | |
| 8,407,449 | B1 | 3/2013 | Colon et al. | |
| 8,423,722 | B1 | 4/2013 | Deforest et al. | |
| 8,433,858 | B1 | 4/2013 | Diggs et al. | |
| 8,443,167 | B1 | 5/2013 | Fallone et al. | |
| 8,447,920 | B1 | 5/2013 | Syu | |
| 8,458,435 | B1 | 6/2013 | Rainey, III et al. | |
| 8,478,930 | B1 | 7/2013 | Syu | |
| 8,489,854 | B1 | 7/2013 | Colon et al. | |
| 8,503,237 | B1 | 8/2013 | Horn | |
| 8,521,972 | B1 | 8/2013 | Boyle et al. | |
| 8,549,236 | B2 | 10/2013 | Diggs et al. | |
| 8,583,835 | B1 | 11/2013 | Kan | |
| 8,601,311 | B2 | 12/2013 | Horn | |
| 8,601,313 | B1 | 12/2013 | Horn | |
| 8,612,669 | B1 | 12/2013 | Syu et al. | |
| 8,612,804 | B1 | 12/2013 | Kang et al. | |
| 8,615,681 | B2 | 12/2013 | Horn | |
| 8,638,602 | B1 | 1/2014 | Horn | |
| 8,639,872 | B1 | 1/2014 | Boyle et al. | |
| 8,683,113 | B2 | 3/2014 | Abasto et al. | |
| 8,700,834 | B2 | 4/2014 | Horn et al. | |
| 8,700,950 | B1 | 4/2014 | Syu | |
| 8,700,951 | B1 | 4/2014 | Call et al. | |
| 8,706,985 | B1 | 4/2014 | Boyle et al. | |
| 8,707,104 | B1 | 4/2014 | Jean | |
| 8,713,066 | B1 | 4/2014 | Lo et al. | |
| 8,713,357 | B1 | 4/2014 | Jean et al. | |
| 8,719,531 | B2 | 5/2014 | Strange et al. | |
| 8,724,422 | B1 | 5/2014 | Agness et al. | |
| 8,725,931 | B1 | 5/2014 | Kang | |
| 8,745,277 | B2 | 6/2014 | Kan | |
| 8,751,728 | B1 | 6/2014 | Syu et al. | |
| 8,769,190 | B1 | 7/2014 | Syu et al. | |
| 8,769,232 | B2 | 7/2014 | Suryabudi et al. | |
| 8,775,720 | B1 | 7/2014 | Meyer et al. | |
| 8,782,327 | B1 | 7/2014 | Kang et al. | |
| 8,788,778 | B1 | 7/2014 | Boyle | |
| 8,788,779 | B1 | 7/2014 | Horn | |
| 8,788,880 | B1 | 7/2014 | Gosla et al. | |
| 8,793,429 | B1 | 7/2014 | Call et al. | |
| 2007/0213946 | A1 * | 9/2007 | Saether | 702/60 |
| 2009/0265042 | A1 * | 10/2009 | Mollenkopf et al. | 700/298 |
| 2010/0123435 | A1 * | 5/2010 | Piazza et al. | 320/128 |
| 2010/0174849 | A1 | 7/2010 | Walston et al. | |
| 2010/0250793 | A1 | 9/2010 | Syu | |
| 2010/0332858 | A1 | 12/2010 | Trantham et al. | |
| 2011/0099323 | A1 | 4/2011 | Syu | |
| 2011/0188146 | A1 | 8/2011 | Oh et al. | |
| 2011/0266982 | A1 | 11/2011 | Rollman | |
| 2011/0283049 | A1 | 11/2011 | Kang et al. | |
| 2012/0117409 | A1 | 5/2012 | Lee et al. | |
| 2012/0194953 | A1 | 8/2012 | Mikolajczak | |
| 2012/0233452 | A1 | 9/2012 | Andresen et al. | |
| 2012/0260020 | A1 | 10/2012 | Suryabudi et al. | |
| 2012/0278531 | A1 | 11/2012 | Horn | |
| 2012/0284460 | A1 | 11/2012 | Guda | |
| 2012/0284561 | A1 | 11/2012 | Wilson | |
| 2012/0286756 | A1 | 11/2012 | Tsukiji et al. | |
| 2012/0311352 | A1 | 12/2012 | Luo et al. | |
| 2012/0324191 | A1 | 12/2012 | Strange et al. | |
| 2013/0036320 | A1 * | 2/2013 | Yoshimura | 713/323 |
| 2013/0132638 | A1 | 5/2013 | Horn et al. | |
| 2013/0145106 | A1 | 6/2013 | Kan | |
| 2013/0205065 | A1 * | 8/2013 | Kloeppner et al. | 711/103 |
| 2013/0290793 | A1 | 10/2013 | Booth et al. | |
| 2014/0059405 | A1 | 2/2014 | Syu et al. | |
| 2014/0101369 | A1 | 4/2014 | Tomlin et al. | |
| 2014/0108846 | A1 * | 4/2014 | Berke et al. | 713/340 |
| 2014/0115427 | A1 | 4/2014 | Lu | |
| 2014/0133220 | A1 | 5/2014 | Danilak et al. | |
| 2014/0136753 | A1 | 5/2014 | Tomlin et al. | |
| 2014/0149826 | A1 | 5/2014 | Lu et al. | |
| 2014/0157078 | A1 | 6/2014 | Danilak et al. | |
| 2014/0181432 | A1 | 6/2014 | Horn | |
| 2014/0223255 | A1 | 8/2014 | Lu et al. | |
| 2014/0281591 | A1 * | 9/2014 | Uan-Zo-Li | 713/300 |

OTHER PUBLICATIONS

International Search Report and Written Opinion dated Oct. 15, 2014 from related PCT Serial No. PCT/US2014/043054, 10 pages.

* cited by examiner

BACKUP POWER FOR REDUCING HOST CURRENT TRANSIENTS

CROSS-REFERENCE TO RELATED APPLICATIONS

This application claims the benefit of U.S. Provisional Application No. 61/837,005, filed on Jun. 19, 2013, which is hereby incorporated by reference in its entirety.

BACKGROUND

New form factors for computers and other electronic devices often require new power requirements. In addition, increasing portability and longer battery life for devices may require more stringent power requirements. For example, data storage devices (DSD), such as solid state drives (SSD), solid state hybrid drives (SSHD), or hard disk drives (HDD) may be restricted in how much current can be drawn from the host.

In order to meet the current restriction or threshold, DSDs throttle the current when the current begins to exceed the current threshold. Throttling the current often requires reducing the performance of the DSD in order to draw less current from the host.

BRIEF DESCRIPTIONS OF THE DRAWINGS

The features and advantages of the implementations of the present disclosure will become more apparent from the detailed description set forth below when taken in conjunction with the drawings. The drawings and the associated descriptions are provided to illustrate implementations of the disclosure and not to limit the scope of what is claimed.

Figure 2:
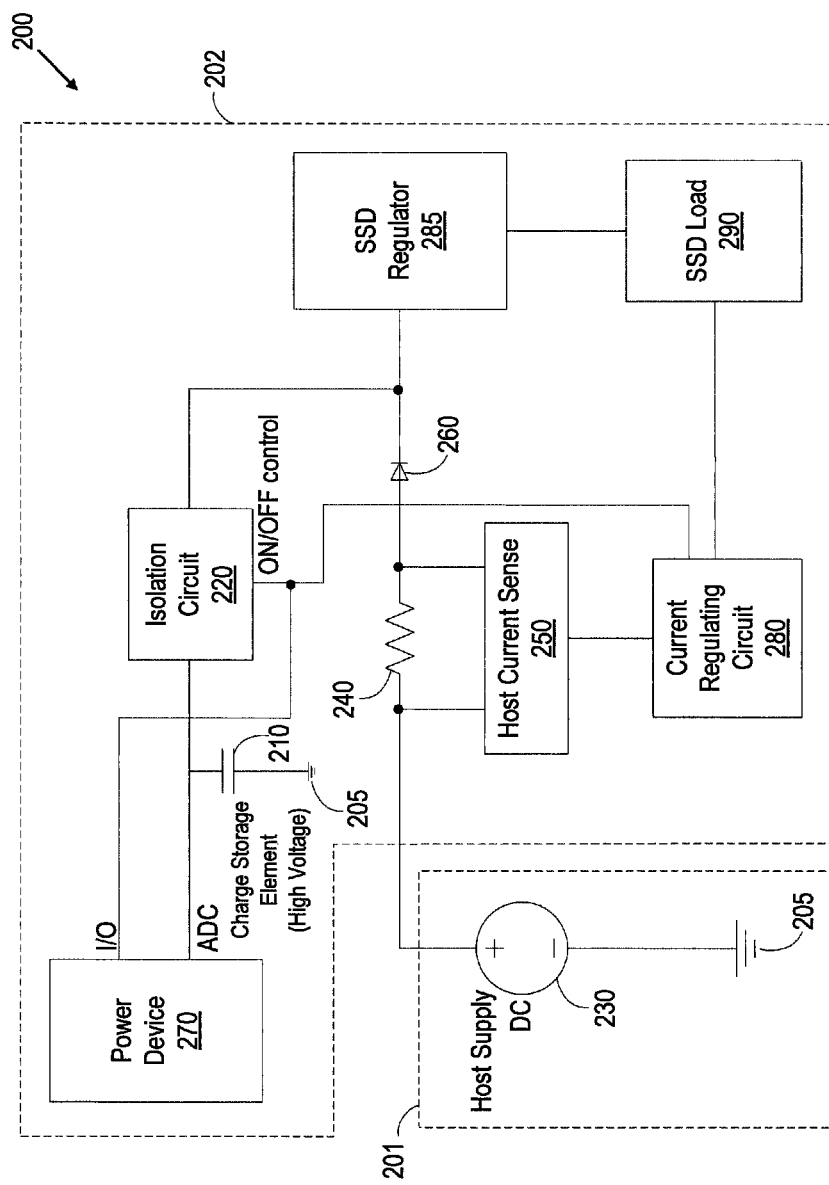
Figure 3:
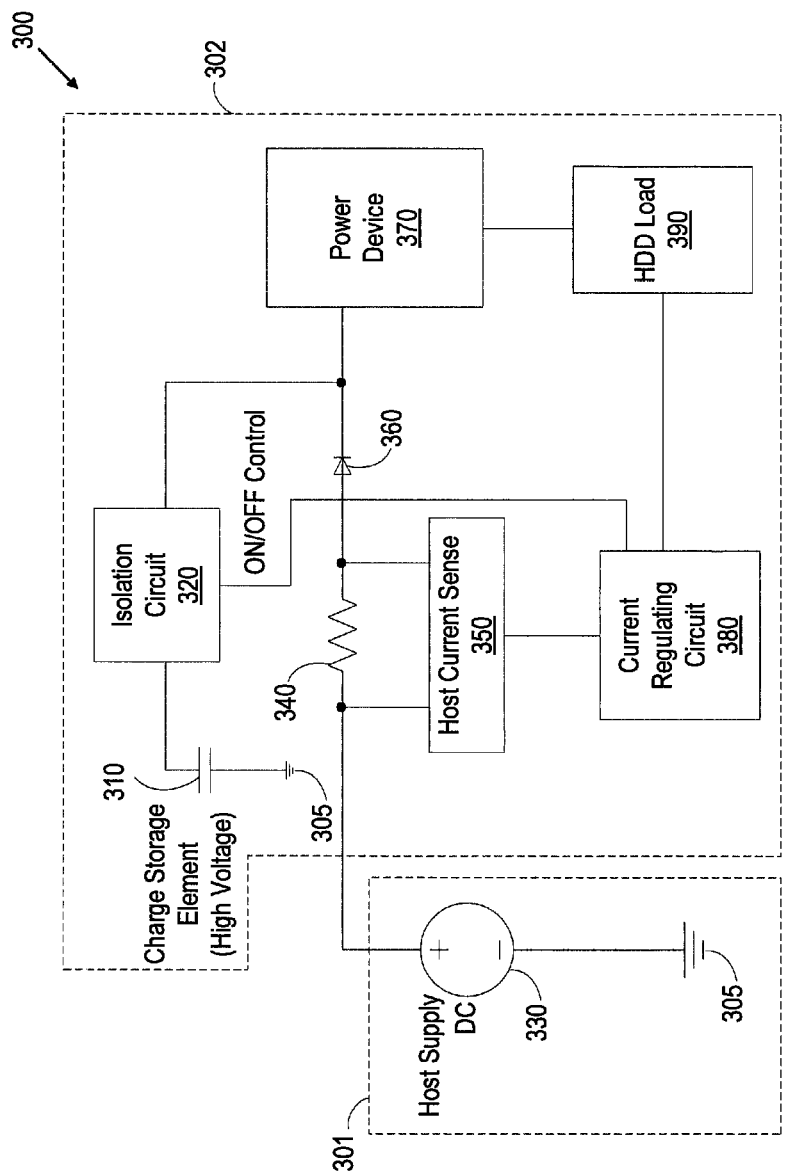
Figure 4:
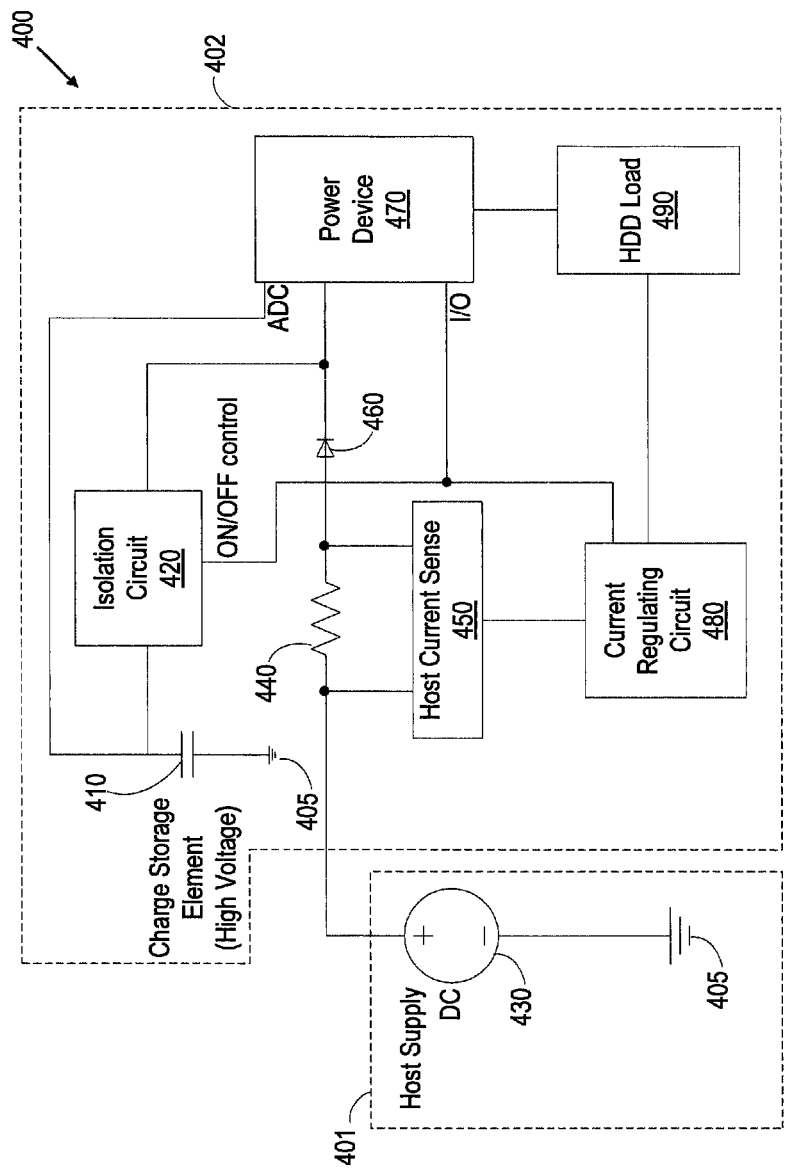
Figure 5:
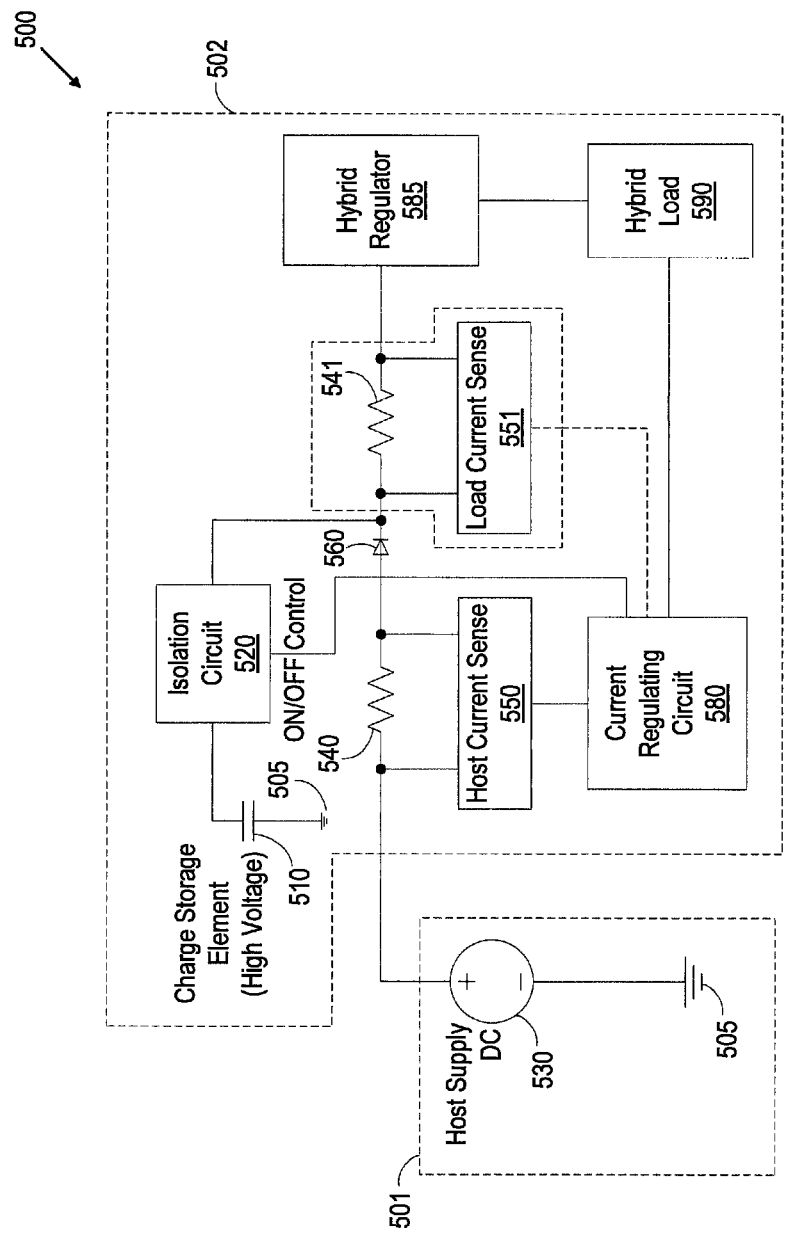
Figure 6:
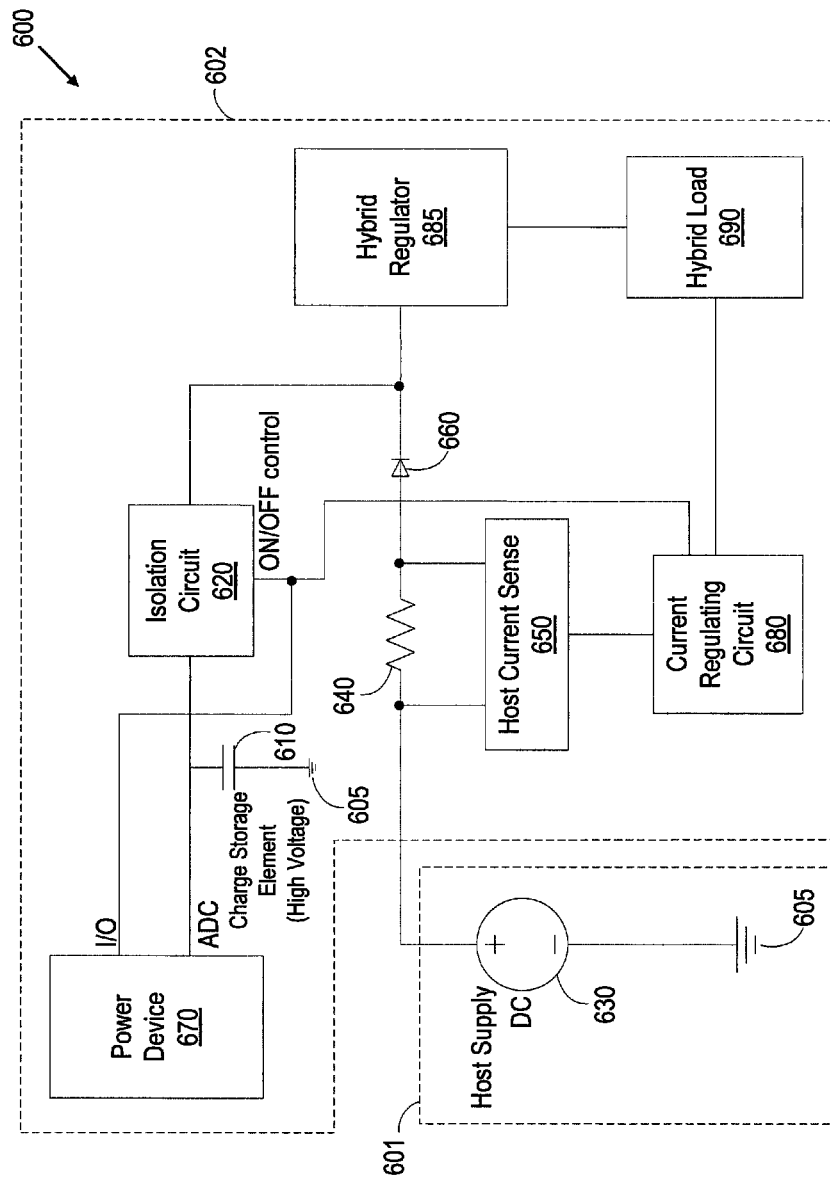
Figure 7:
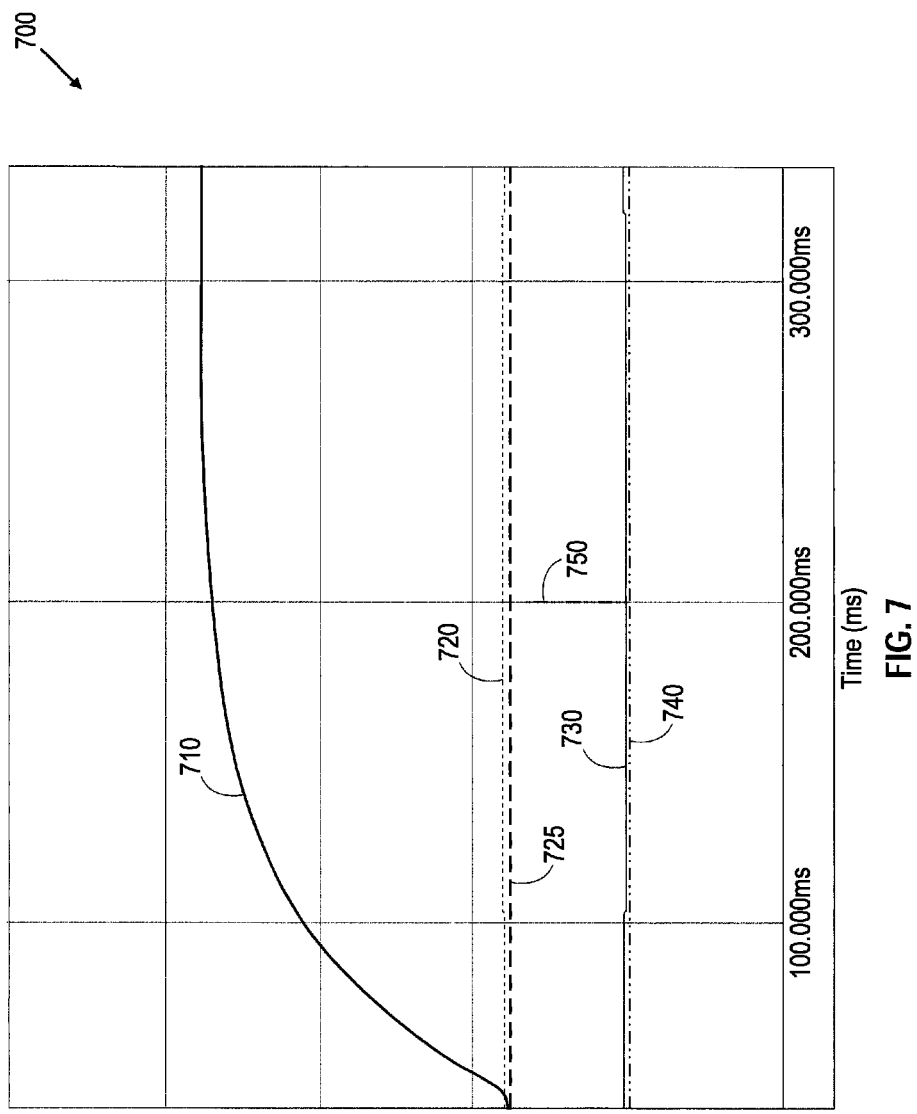
Figure 8:
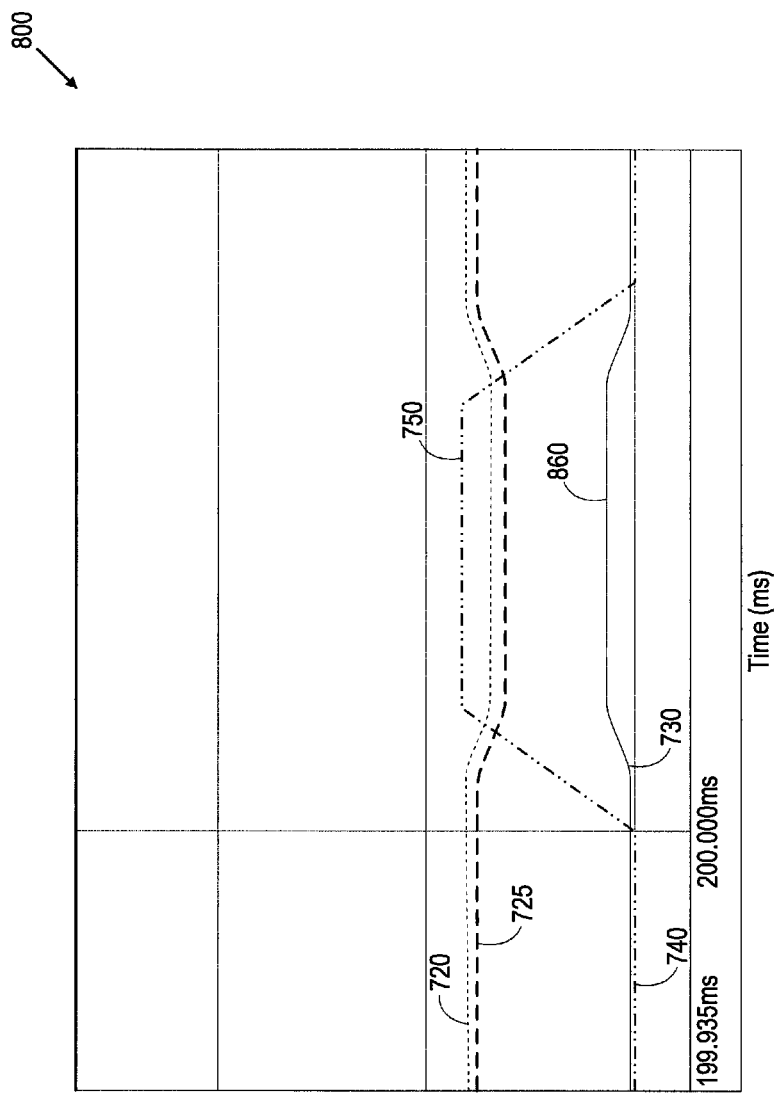
Figure 9:
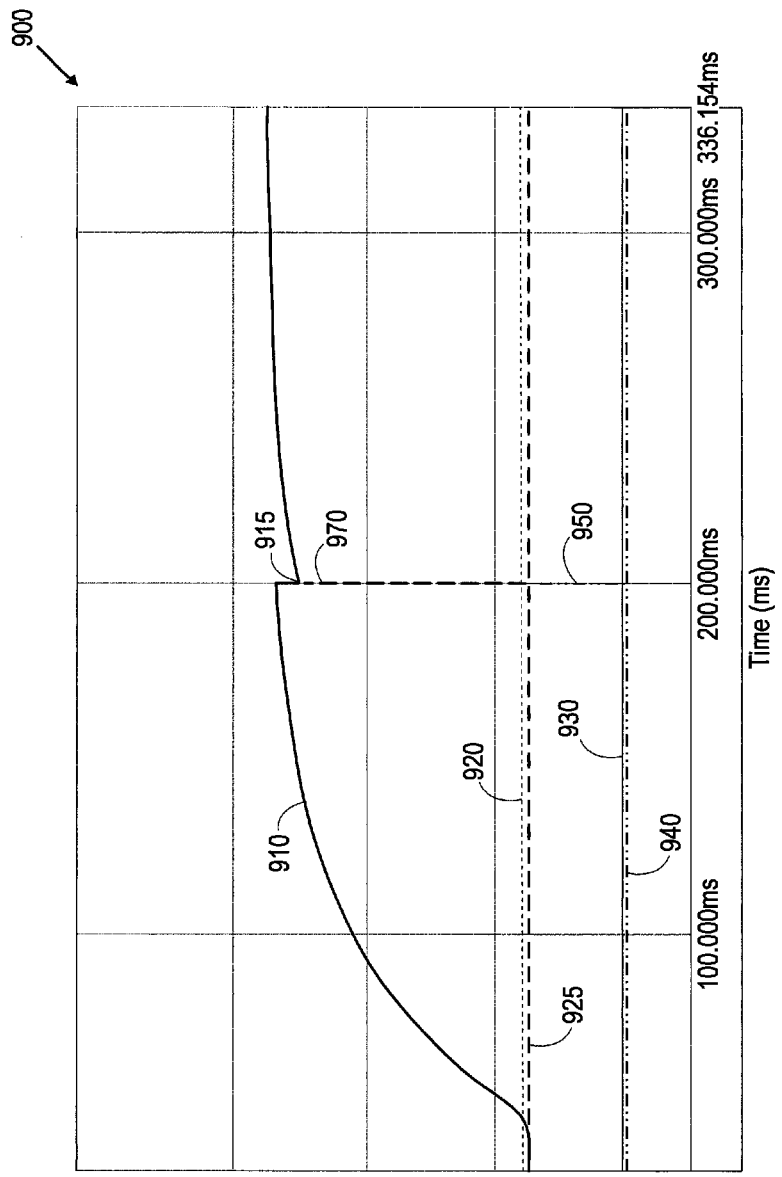
Figure 10:
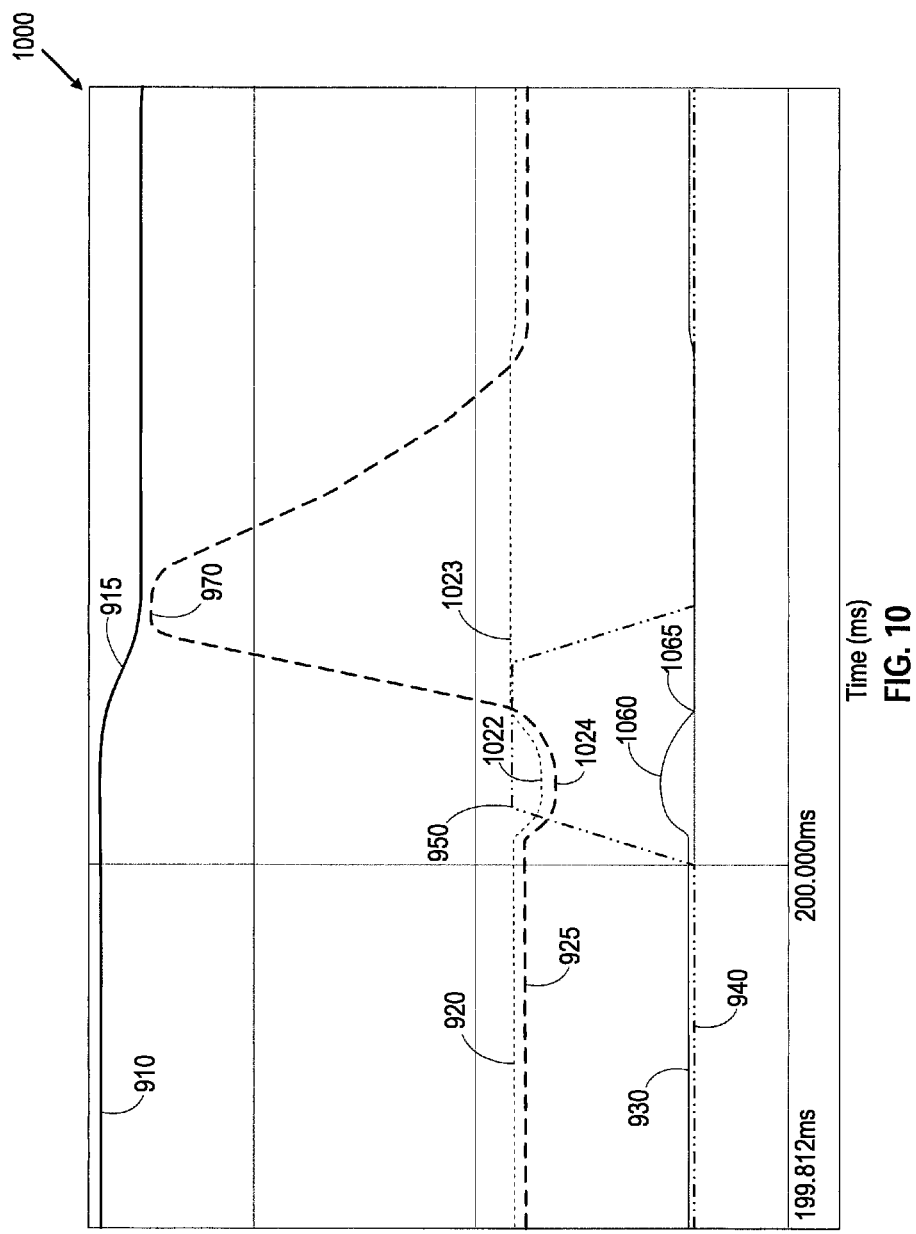

FIG. 1 presents a block diagram of a current regulating circuit and switch control circuit of an SSD according to one implementation of the present disclosure;

FIG. 2 presents a block diagram of a current regulating circuit and switch control circuit of an SSD according to one implementation of the present disclosure;

FIG. 3 presents a block diagram of a current regulating circuit and switch control circuit of an HDD according to one implementation of the present disclosure;

FIG. 4 presents a block diagram of a current regulating circuit and switch control circuit of an HDD according to one implementation of the present disclosure;

FIG. 5 presents a block diagram of a current regulating circuit and switch control circuit of an SSHD according to one implementation of the present disclosure;

FIG. 6 presents a block diagram of a current regulating circuit and switch control circuit of an SSHD according to one implementation of the present disclosure;

FIG. 7 presents a graph of voltages and currents without using a charge storage element according to one implementation of the present disclosure;

FIG. 8 presents a zoomed in view of the graph of FIG. 7;

FIG. 9 presents a graph of voltages and currents while using a charge storage element according to one implementation of the present disclosure;

FIG. 10 presents a zoomed in view of the graph of FIG. 9; and

Figure 11:
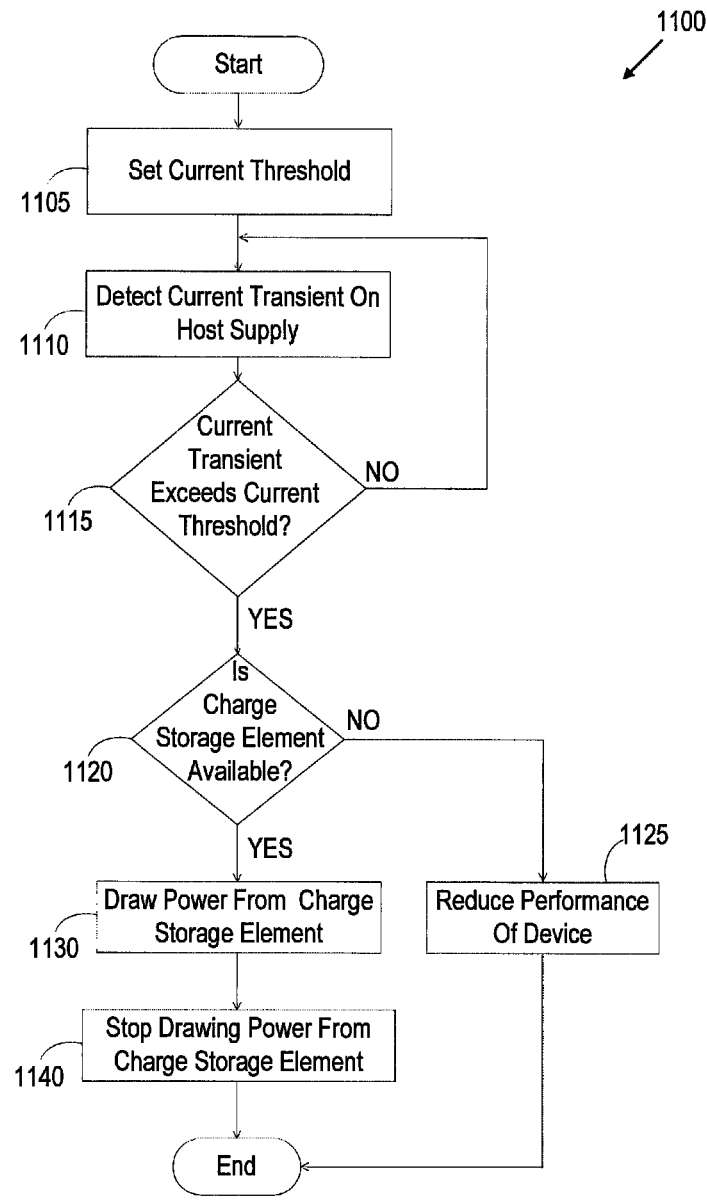

FIG. 11 presents a flowchart according to one implementation of the present disclosure.

DETAILED DESCRIPTION

In the following detailed description, numerous specific details are set forth to provide a full understanding of the present disclosure. It will be apparent, however, to one of ordinary skill in the art that the various implementations disclosed may be practiced without some of these specific details. In other instances, well-known structures and techniques have not been shown in detail to avoid unnecessarily obscuring the various implementations.

FIG. 1 illustrates a block diagram of a circuit 100 having a power circuitry 102 coupled to a host circuitry 101. The power circuitry 102 may, for example, correspond to power circuitry for an SSD or SSHD including a solid state memory. While the description herein refers generally to solid state memory, it is understood that particular implementations can include one or more of various types of solid state memory such as Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete NVM (non-volatile memory) chips, or any combination thereof.

In the example of FIG. 1, the power circuitry 102 comprises a charge storage element 110, a ground 105, an isolation circuit 120, a resistor 140, a host current sense 150, a diode 160, a current regulating circuit 180, an SSD regulator 185, and an SSD load 190. The power circuitry 102 optionally includes a resistor 141 and a load current sense 151. The host circuitry 101 includes a host supply 130 coupled to the ground 105.

The charge storage element 110 is configured to store power and provide the stored power to the SSD regulator 185. The charge storage element 110 can, for example, include a capacitor or multiple capacitors in a capacitor farm.

The SSD regulator 185 powers and controls the SSD load 190. The SSD regulator 185 normally draws power from the host supply 130. The host current sense 150 senses a current across the resistor 140 to measure the current drawn from the host supply 130. Alternatively, a resistor 141 coupled to a load current sense 151 may be connected on the other side of the diode 160 to sense a current load into an input of the SSD regulator 185. In certain implementations only one of a host current or load current may be measured, and in other implementations both may be measured. The current regulating circuit 180 determines when the current exceeds a current threshold. Conventionally, when a transient event such as a current transient or current spike is detected, the current regulating circuit 180 and/or the SSD regulator 185 throttles down performance of the SSD load 190 in order to bring down the current below the current threshold. The performance may be throttled by, for instance, reducing a data rate, or the number of pages written to.

Although throttling performance achieves current throttling, the reduction in performance is undesirable. The present disclosure achieves current regulation without ordinarily having to throttle performance. Rather than throttling down performance to reduce the current needed from the host supply 130, the charge storage element 110 provides supplemental power to meet the power needs beyond what is available at the current threshold. The current regulating circuit 180, using signals from the host current sense 150, determines when the current from the host is nearing the current threshold. The current regulating circuit 180 then sends an ON signal to or otherwise controls the isolation circuit 120. The isolation circuit 120 connects the charge storage element 110 to the SSD regulator 185 so that the charge storage element 110 also provides power to the SSD regulator 185.

Because of the power provided by the charge storage element 110, less current is drawn from the host supply 130. The diode 160 prevents the current from the charge storage element 110 from flowing back to the host supply 130. Thus, the host supply current is regulated to stay below the current threshold while the performance of the SSD load 190 is not reduced.

The charge storage element 110 may include one or more capacitors. The charge storage element 110 also provides backup power for backup events. If the host supply 130 was suddenly disconnected, such as from a power outage, the charge storage element 110 provides backup power to allow the SSD load 190 to gracefully shutdown without the loss of data. However, the charge storage element 110 requires a sufficient reserve of energy to provide backup power.

To prevent the charge storage element 110 from draining too much power, the current regulating circuit 180 selectively switches on the isolation circuit 120. In the implementation depicted in FIG. 1, the current regulating circuit 180 counts the number of transient events requiring switching to the charge storage element 110 that have occurred. Depending on the number and/or size of the capacitors in the charge storage element 110, the current regulating circuit 180 may have a pre-determined limit of transient events during a pre-determined time period. For example, the pre-determined limit may be 30 transient events in a 20 ms span. The current regulating circuit 180 keeps a counter of transient events triggering the isolation circuit 120. If the counter reaches the limit, on subsequent transient events the current regulating circuit 180 will not switch on the isolation circuit 120. Instead, the current regulating circuit 180 may throttle down performance of the SSD load 190, or utilize other conventional methods of throttling the current.

The counter may be reset or reduced after sufficient time has passed. The sufficient time may be pre-determined based on calculating the time needed to recharge the charge storage element 110. Thus, the current regulating circuit 180 prevents the charge storage element 110 from completely draining.

FIG. 2 illustrates a circuit 200 including a host circuitry 201 and a power circuitry 202 which may, for example correspond to power circuitry for an SSD or an SSHD. The host circuitry 201 comprises a host supply 230 and a ground 205. The power circuitry comprises a power device 270, an isolation circuit 220, a charge storage element 210, a ground 205, a resistor 240, a host current sense 250, a diode 260, a current regulating circuit 280, a SSD regulator 285, and a SSD load 290. The components may correspond to similarly named components in the circuit 100. However, rather than managing the charge storage element 210 with a counter of transient events, the circuit 200 utilizes an analog-to-digital converter (ADC) to measure the voltage level of the charge storage element 210.

In FIG. 2, the power device 270 has an ADC coupled to the charge storage element 210. As in the circuit 100, the current regulating circuit 280 determines a transient event based on signals from the host current sense 250 sensing a current across the resistor 240. When the current reaches the current threshold, the current regulating circuit 280 switches on the isolation circuit 220 so that the charge storage element 210 provides power to the SSD regulator 285. The power device 270 can detect a voltage level of the charge storage element 210. When the charge storage element 210 reaches a minimum threshold, which may correspond to the minimum power required to provide sufficient backup power, the power device 270 can prevent the isolation circuit 220 from switching on. Alternatively, the power device 270 may override the ON signals from the current regulating circuit 280. When sufficient time has passed, or when the power device 270 detects that the voltage level of the charge storage element 210 is sufficiently charged, the power device 270 may then allow the isolation circuit 220 to switch power to the charge storage element 210 when needed.

FIGS. 3 and 4 illustrate circuits 300 and 400, respectively, which may, for example, correspond to power circuitry for an HDD. The circuit 300 comprises a host circuitry 301 which includes a host supply 330 and a ground 305, and a power circuitry 302 which includes a charge storage element 310, an isolation circuit 320, a resistor 340, a host current sense 350, a diode 360, a power device 370, a current regulating circuit 380, an HDD load 390, and a ground 305.

Rather than an SSD load, the circuit 300 includes the HDD load 390, which may correspond to power drawn from the HDD. The power device 370 powers and regulates the HDD load 390. However, the other components may correspond to similarly named components in the circuit 100. Similar to the current regulating circuit 180 in FIG. 1, the current regulating circuit 380 has a counter of transient events in order to manage and maintain the power level of the charge storage element 310, keeping enough power for backup.

The circuit 400 in FIG. 4 comprises a host circuitry 401 including a host supply 430 and a ground 405, and a power circuitry 402 including a charge storage element 410, an isolation circuit 420, a resistor 440, a host current sense 450, a diode 460, a power device 470, a current regulating circuit 480, an HDD load 490, and a ground 405. Unlike the circuit 200, the circuit 400 includes the HDD load 490, controlled by the power device 470. However, the other components may correspond to similarly named components in the circuit 200.

The power device 470 includes an ADC which can detect a voltage level of the charge storage element 410. When the voltage level of the charge storage element 410 drops too low, the power device 470 may prevent the isolation circuit 420 from switching to the charge storage element 410. When the voltage level of the charge storage element 410 returns to a sufficient level, the power device 470 re-enables the isolation circuit 420.

FIGS. 5 and 6 illustrate circuits 500 and 600, respectively, which may, for example, correspond to power circuitry for a hybrid drive (SSHD). A hybrid drive may include both a hard drive disk and a solid state memory, such as a NAND flash. The circuit 500 comprises a host circuitry 501 which includes a host supply 530 and a ground 505, and a power circuitry 502 which includes a charge storage element 510, an isolation circuit 520, a resistor 540, a host current sense 550, a diode 560, a hybrid regulator 585, a current regulating circuit 580, a hybrid load 590, and a ground 505. Optionally, the power circuitry 502 may include a resistor 541 and a load current sense 551, in addition to or in place of the resistor 540 and the host current sense 550.

Rather than an SSD or an HDD load, the circuit 500 includes the hybrid load 590, which may correspond to power drawn from the HDD and/or the solid state memory. The hybrid regulator 585 powers and regulates the hybrid load 590. However, the other components may correspond to similarly named components in the circuit 100. Similar to the current regulating circuit 180 in FIG. 1, the current regulating circuit 580 has a counter of transient events in order to manage and maintain the power level of the charge storage element 510, keeping enough power for backup.

The circuit 600 in FIG. 6 comprises a host circuitry 601 including a host supply 630 and a ground 605, and a power circuitry 602 including a charge storage element 610, an isolation circuit 620, a resistor 640, a host current sense 650, a diode 660, a power device 670, a hybrid regulator 685, a current regulating circuit 680, a hybrid load 690, and a ground 605. The hybrid load 690 may correspond to power drawn from the HDD and/or SSD of a hybrid drive. Unlike the circuit 200, the circuit 600 includes the hybrid load 690, controlled by the hybrid regulator 685. However, the other components may correspond to similarly named components in the circuit 200.

The power device 670 includes an ADC which can detect a voltage level of the charge storage element 610. When the voltage level of the charge storage element 610 drops too low, the power device 670 may prevent the isolation circuit 620 from switching to the charge storage element 610. When the voltage level of the charge storage element 610 returns to a sufficient level, the power device 670 re-enables the isolation circuit 620.

FIGS. 7 and 8 present graphs 700 and 800, respectively, of voltage and current levels juxtaposed over time, without using a charge storage element such as the charge storage element 110 of FIG. 1 or the charge storage element 210 of FIG. 2.

In FIG. 7, a capacitor voltage curve 710 rises as the charge storage element charges over time. For example, the capacitor voltage curve 710 may charge up to 17 V, or any other appropriate voltage level. A host supply curve 720 illustrates a voltage level from the host supply, and an SSD voltage curve 725 illustrates a voltage level at an SSD (e.g., SSD load 190 of FIG. 1 or SSD load 290 of FIG. 2). A host current curve 730 depicts a current drawn from the host supply. A load curve 740 depicts a load of the SSD. In FIG. 7, a transient event occurs at 200 ms, shown as a load spike 750.

FIG. 8 illustrates a zoomed in view of the graph 700 near the transient event. The curves in the graph 800 correspond to similarly named curves in the graph 700. At 200 ms, the load curve 740 rises to the load spike 750, corresponding to the transient event. The host supply falls, as seen in the host supply curve 720. Similarly, the SSD voltage curve 725 falls. The host current increases, as seen in the host current curve 730 rising to a current spike 860. The host supply falls and the host current increases during the transient event.

FIGS. 9 and 10 illustrate graphs 900 and 1000, respectively, of voltage and current levels juxtaposed over time, with using a charge storage element such as charge storage elements 110 or 210 from FIGS. 1 and 2. In FIG. 9, a capacitor voltage curve 910 rises as the charge storage element charges over time, similar to FIG. 7. The graph 900 further shows a host supply curve 920, an SSD voltage curve 925, a host current curve 930, and a load curve 940. The transient event occurs at 200 ms, corresponding to a load spike 950. However, because the charge storage element provides power, the capacitor voltage curve 910 experiences a voltage drop 915. In addition, because the charge storage element is connected to an SSD load, the SSD voltage curve 925 experiences a voltage spike 970, as the SSD voltage level rises to that of the charge storage element.

FIG. 10 illustrates a zoomed in view of the graph 900 near the transient event at 200 ms. The curves in the graph 1000 correspond to similarly named curves in the graph 900. At 200 ms, the load curve 940 rises to the load spike 950. Similar to FIG. 8, the host supply curve 920 experiences a host supply drop 1022, and the SSD voltage curve 925 similarly experiences an SSD voltage drop 1024. The host current curve 930 also experiences a current spike 1060. However, when the charge storage element begins providing power, the curves diverge from those of FIG. 8.

The capacitor voltage curve 910 experiences voltage drop 915. In response, the SSD voltage curve rises to a voltage level near that of the charge storage element, illustrated by the voltage spike 970, because the charge storage element is now connected to the SSD. The dips (e.g., the host supply drop 1022 and the SSD voltage drop 1024) in the host supply curve 920 and the SSD voltage curve 925, respectively, do not last the duration of the load spike 950. The host supply curve 920 returns to a current level 1023 while the SSD voltage curve 925 rises to the voltage spike 970. At approximately the same time, the host current curve 930 experiences a current drop 1065 such that the current spike 1060 also does not last the duration of the load spike 950. The amplitude and duration of the current spike 1060 is less than those of the current spike 860 in FIG. 8. Accordingly, the use of the charge storage element can maintain the host current below a current threshold.

FIG. 11 presents a flowchart 1100 of a logic which can be performed by a current regulating circuit (e.g., current regulating circuits 180, 280, 380 or 480) in an electronic device. At 1110, a current transient is detected on a host power supply. A host current sense may be used by the current regulating circuit to sense a current across a current sense resistor, or other known methods of detecting current may be used. At 1115, the current regulating circuit determines whether the detected current transient exceeds a current threshold. The current threshold may be a set current value such as slightly less than a current provided by the host power supply. For example, the current threshold may correspond to a current limit of the host power supply. In other implementations, an algorithm may be performed by the current regulating circuit which analyzes a rate of the current transient to determine a dynamic current threshold. In such implementations, a relatively fast spike in the transient current may result in setting a lower current threshold in determining whether the current transient exceeds the current threshold in 1115.

If it is determined that the current transient does not exceed the current threshold in 1115, the logic returns to 1110 to continue to detect the current transient on the host power supply.

On the other hand, if the current regulating circuit determines in 1115 that the current transient exceeds the current threshold, the current regulating circuit in 1120 determines the availability of a charge storage element (e.g., charge storage elements 110, 210, 310 or 410). The charge storage element may be unavailable due to a low voltage level, such as if the voltage level of the charge storage element falls below a predetermined voltage.

In an implementation where the electronic device is a DSD, the predetermined voltage may be a voltage sufficient to safely shut down the DSD after an unexpected power loss without data loss. For example, for SSD drives, a reserve power in the charge storage element may be needed to prevent data corruption, such as paired page corruption, from power loss. However, other DSDs, such as HDDs, may not require a reserve power. In these implementations, the predetermined voltage may be at or near 0 volts. In other words, the charge storage element may be fully drained.

The charge storage element may be temporarily unavailable as it charges up after providing power for several transient events. The availability of the charge storage element may be determined using a counter of transient events, or through measuring the voltage level of the charge storage element. In other implementations, the amplitude of the charge storage element voltage may be utilized, which may require additional circuitry.

If the charge storage element is unavailable in 1120, the current regulating circuit reduces the performance of the electronic device in 1125 and the logic ends.

If the charge storage element is available, the current regulating circuit in 1130 allows the electronic device to draw power from the charge storage element. In certain implementations the host power supply may be disconnected as well. At 1140, the current regulating circuit disables the power supply from the charge storage element so that the electronic device stops drawing power from the charge storage element. The electronic device may stop drawing power from the charge storage element after a set period of time. Such a period of time may be based upon empirical testing. In other implementations, the electronic device may stop drawing power from the charge storage element after a voltage level of the charge storage element falls below a predetermined voltage as discussed above with respect to 1120. The electronic device may also stop drawing power from the charge storage element if a detected current drawn by the electronic device falls below a predetermined current indicating an end of the transient event. Once the electronic device stops drawing power from the charge storage element, the charge storage element can recharge and the logic of FIG. 11 ends.

Those of ordinary skill in the art will appreciate that the various illustrative logical blocks, modules, and processes described in connection with the examples disclosed herein may be implemented as electronic hardware, computer software, or combinations of both. Furthermore, the foregoing processes can be embodied on a computer readable medium which causes a processor or computer to perform or execute certain functions.

To clearly illustrate this interchangeability of hardware and software, various illustrative components, blocks, and modules have been described above generally in terms of their functionality. Whether such functionality is implemented as hardware or software depends upon the particular application and design constraints imposed on the overall system. Those of ordinary skill in the art may implement the described functionality in varying ways for each particular application, but such implementation decisions should not be interpreted as causing a departure from the scope of the present disclosure.

The various illustrative logical blocks, units, modules, and controllers described in connection with the examples disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The activities of a method or process described in connection with the examples disclosed herein may be embodied directly in hardware, in a software module executed by a processor, or in a combination of the two. The steps of the method or algorithm may also be performed in an alternate order from those provided in the examples. A software module may reside in RAM memory, flash memory, ROM memory, EPROM memory, EEPROM memory, registers, hard disk, a removable media, an optical media, or any other form of storage medium known in the art. An exemplary storage medium is coupled to the processor such that the processor can read information from, and write information to, the storage medium. In the alternative, the storage medium may be integral to the processor. The processor and the storage medium may reside in an Application Specific Integrated Circuit (ASIC).

The foregoing description of the disclosed example implementations is provided to enable any person of ordinary skill in the art to make or use the implementations in the present disclosure. Various modifications to these examples will be readily apparent to those of ordinary skill in the art, and the principles disclosed herein may be applied to other examples without departing from the spirit or scope of the present disclosure. The described implementations are to be considered in all respects only as illustrative and not restrictive and the scope of the disclosure is, therefore, indicated by the following claims rather than by the foregoing description. All changes which come within the meaning and range of equivalency of the claims are to be embraced within their scope.

What is claimed is:

1. A data storage device (DSD) including a power supply from a host, the DSD comprising:
    a charge storage element for supplying power for the DSD;
    current sense circuitry for detecting a current transient on the power supply from the host; and
    a current regulating circuit configured to:
        determine whether the current transient exceeds a current threshold that corresponds to a current limit of the power supply from the host;
        when the current transient exceeds the current threshold, cause the DSD to draw power from the charge storage element; and
        stop power drawn from the charge storage element.

2. The DSD of claim 1, wherein the current regulating circuit is further configured to stop power drawn from the charge storage element after at least one of:
    a predetermined period of time,
    when a voltage level of the charge storage element reaches or falls below a threshold voltage, and
    when a current transient of power drawn by the DSD no longer exceeds the current threshold.

3. The DSD of claim 2, wherein the threshold voltage corresponds to a voltage used to provide the DSD with power after an unexpected loss in power supplied from the host.

4. The DSD of claim 2, wherein the threshold voltage is 0 volts.

5. The DSD of claim 1, wherein the current regulating circuit is further configured to determine whether the charge storage element is available to supply power.

6. The DSD of claim 5, wherein the current regulating circuit is further configured to determine whether the charge storage element is available to supply power by:
    comparing a voltage level of the charge storage element to a threshold voltage; and
    determining that the charge storage element is not available when the voltage level is at or below the threshold voltage.

7. The DSD of claim 1, further comprising a solid state memory.

8. The DSD of claim 1, further comprising a hard disk drive.

9. The DSD of claim 1, further comprising a hybrid drive.

10. A method for reducing current transients for a power supply from a host to a data storage device (DSD) including a charge storage element, the method comprising:
    detecting a current transient on the power supply from the host to the DSD;
    determining whether the current transient exceeds a current threshold that corresponds to a current limit of the power supply from the host;

when the current transient exceeds the current threshold, drawing power from the charge storage element to reduce power drawn from the host; and stopping power drawn from the charge storage element.

11. The method of claim 10, wherein stopping power drawn from the charge storage element occurs after at least one of:

a predetermined period of time, when a voltage level of the charge storage element falls below a threshold voltage, and when a current transient of power drawn by the DSD no longer exceeds the current threshold.

12. The method of claim 11, wherein the threshold voltage corresponds to a voltage used to provide the DSD with power after an unexpected loss in power supplied from the host.

13. The method of claim 10, further comprising determining whether the charge storage element is available to supply power.

14. The method of claim 13, wherein determining whether the charge storage element is available to supply power includes:

comparing a count of current transients that exceed the current threshold in a time period to a predetermined limit; and determining that the charge storage element is not available when the count of current transients for the time period exceeds the predetermined limit.

15. The method of claim 13, wherein determining whether the charge storage element is available to supply power includes:

comparing a voltage level of the charge storage element to a threshold voltage; and determining that the charge storage element is not available when the voltage level is below the threshold voltage.

16. The method of claim 13, further comprising reducing a performance of the DSD when it is determined that the charge storage element is not available to supply power.

17. The method of claim 10, further comprising setting the current threshold based on a rate of change of the current transient.

18. A data storage device (DSD) including a power supply from a host, the DSD comprising:

a charge storage element for supplying power for the DSD;

current sense circuitry for detecting a current transient on the power supply from the host; and a current regulating circuit configured to:

determine whether the current transient exceeds a current threshold;

when the current transient exceeds the current threshold, determine whether the charge storage element is available to supply power by:

comparing a count of current transients which exceed a current threshold in a time period to a predetermined limit; and determining that the charge storage element is not available when the count of current transients for the time period exceeds the predetermined limit;

when the current transient exceeds the current threshold and the charge storage element is available to supply power, cause the DSD to draw power from the charge storage element; and stop power drawn from the charge storage element.

19. A data storage device (DSD) including a power supply from a host, the DSD comprising:

a charge storage element for supplying power for the DSD;

current sense circuitry for detecting a current transient on the power supply from the host; and a current regulating circuit configured to:

determine whether the current transient exceeds a current threshold;

detennine whether the charge storage element is available to supply power;

when the current transient exceeds the current threshold and the charge storage element is available to supply power, cause the DSD to draw power from the charge storage element;

stop power drawn from the charge storage element; and when the current transient exceeds the current threshold but the charge storage element is not available to supply power, reduce a performance of the DSD.

20. A data storage device (DSD) including a power supply from a host, the DSD comprising:

a charge storage element for supplying power for the DSD;

current sense circuitry for detecting a current transient on the power supply from the host; and a current regulating circuit configured to:

determine whether the current transient exceeds a current threshold set based on a rate of change of the current transient;

when the current transient exceeds the current threshold, cause the DSD to draw power from the charge storage element; and stop power drawn from the charge storage element.

* * * * *